US012660526B2

(12) United States Patent
Hsu et al.

(10) Patent No.: US 12,660,526 B2
(45) Date of Patent: Jun. 16, 2026

(54) GAS CURTAIN DEVICE AND GAS PERMEABLE ASSEMBLY WITH BAFFLE PLATE

(71) Applicant: BRILLIAN NETWORK & AUTOMATION INTEGRATED SYSTEM CO., LTD., Miaoli County (TW)

(72) Inventors: Sheng-Chi Hsu, Miaoli County (TW); Han-Cheng Hu, Miaoli County (TW)

(73) Assignee: BRILLIAN NETWORK & AUTOMATION INTEGRATED SYSTEM CO., LTD., Miaoli County (TW)

( * ) Notice: Subject to any disclaimer, the term of this patent is extended or adjusted under 35 U.S.C. 154(b) by 885 days.

(21) Appl. No.: 17/888,021

(22) Filed: Aug. 15, 2022

(65) Prior Publication Data

US 2023/0343584 A1      Oct. 26, 2023

(30) Foreign Application Priority Data

Apr. 22, 2022    (TW) .................................. 111115374

(51) Int. Cl.
H10P 14/60        (2026.01)
H10P 72/76        (2026.01)

(52) U.S. Cl.
CPC ...... H10P 14/6328 (2026.01); H10P 72/7618 (2026.01); H10P 72/7621 (2026.01)

(58) Field of Classification Search
CPC ................................................ H01L 21/02263
See application file for complete search history.

(56) References Cited

U.S. PATENT DOCUMENTS

| | | | |
|---|---|---|---|
| 3,726,204 A | 4/1973 | Lindestrom | |
| 2008/0078744 A1* | 4/2008 | Wang ...................... | H01J 37/16 |
| | | | 438/689 |
| 2008/0314523 A1* | 12/2008 | Iizuka ................. | H01J 37/3244 |
| | | | 118/723 R |
| 2009/0073397 A1* | 3/2009 | Vogel .................. | G03F 7/70775 |
| | | | 355/30 |
| 2016/0059380 A1* | 3/2016 | Yamaguchi ............... | B08B 1/32 |
| | | | 451/72 |

(Continued)

FOREIGN PATENT DOCUMENTS

| | | |
|---|---|---|
| CN | 209169114 U | 7/2019 |
| TW | M511123 U | 10/2015 |

(Continued)

OTHER PUBLICATIONS

Office Action of a China in application No. 202210513353.6 dated on Jul. 12, 2025 and its English translation; pp. 1-21.

*Primary Examiner* — Peter Bradford
(74) *Attorney, Agent, or Firm* — MUNCY, GEISSLER, OLDS & LOWE, P.C.

(57)        ABSTRACT

A gas curtain device includes a main body having at least one gas inlet and a gas permeable assembly disposed inside the main body. The gas permeable assembly includes a baffle plate provided with a plurality of through holes and a gas permeable plate made of a porous material containing plenty of pores. A gas enters the main body via the at least one gas inlet, passes through the through holes of the baffle plate, and is discharged from the gas permeable plate.

9 Claims, 8 Drawing Sheets

(56) References Cited

U.S. PATENT DOCUMENTS

| 2022/0034532 | A1  | 2/2022  | Hu et al. | |
| 2022/0310429 | A1* | 9/2022  | Shiu | H01L 21/67778 |
| 2023/0369082 | A1* | 11/2023 | Wu   | H01L 21/67017 |

FOREIGN PATENT DOCUMENTS

| TW | M520194 | U | 4/2016 |
| TW | M565395 | U | 8/2018 |
| TW | I716878 | B | 1/2021 |
| TW | M622666 | U | 1/2022 |

* cited by examiner

32

321

34

P

P

341

10a

32

321          322          22

10b

20

22

20a

H

T

GS

36

20b

20

20b

H

20a

100

GAS CURTAIN DEVICE AND GAS PERMEABLE ASSEMBLY WITH BAFFLE PLATE

CROSS-REFERENCE TO RELATED APPLICATION

This application claims the priority benefit of Taiwan application no. 111115374, filed Apr. 22, 2022. The entirety of the above-mentioned patent application is hereby incorporated by reference herein and made a part of this specification.

BACKGROUND

Field of the Invention

The invention relates to a gas curtain device and a gas permeable assembly.

Description of the Related Art

Processing of substrates in semiconductor electronic device manufacturing is generally carried out in multiple process chambers, where substrates travel between process chambers in substrate carriers such as front opening unified pods (FOUPs). In order to keep transfer spaces (such as spaces between doors of substrate carriers and process chambers) extremely clean during wafer transport processes, a gas curtain device capable of providing clean gas flows has been proposed to block external particles or contamination from entering the substrate carriers. However, gas permeable plates of a conventional gas curtain device are liable to be damaged after suffering long-term high wind pressures. Besides, in some process environments, the space reserved for a gas curtain device is significantly limited, and thus the volume of a gas curtain device needs to be reduced. This may cause an insufficient space between a gas inlet and a gas permeable plate in the gas curtain device to result in uneven velocity distribution of clean gas blown out by the gas curtain device.

BRIEF SUMMARY OF THE INVENTION

According to one aspect of the invention, a gas curtain device includes a main body having at least one gas inlet and a gas permeable assembly disposed inside the main body. The gas permeable assembly includes a baffle plate provided with a plurality of through holes and a gas permeable plate made of a porous material containing plenty of pores. A gas enters the main body via the at least one gas inlet, passes through the through holes of the baffle plate, and is discharged from the gas permeable plate.

According to another aspect of the invention, a gas permeable assembly includes a baffle plate and a gas permeable plate. The baffle plate is provided with a gas inlet face and has a plurality of through holes, and the gas permeable plate is provided with a gas outlet face and made of a porous material containing plenty of pores. A clean gas enters the gas permeable assembly via the gas inlet and discharged from the gas permeable assembly via the gas outlet face. A thickness of the baffle plate is smaller than a thickness of the gas permeable plate, and diameters of the through holes are larger than diameters of the plenty of pores of the gas permeable plate.

According to another aspect of the invention, a gas curtain device includes a main body and a single gas permeable plate. The main body includes a first surface, a second surface opposite the first surface, and at least one side surface connected between the first surface and the second surface, and the main body has at least one gas inlet. The single gas permeable plate is disposed inside the main body and adjacent to the second surface, and a gas is discharged from the single gas permeable plate at a velocity of 0.1 m/s-2 m/s. The single gas permeable plate is made of a porous material and satisfies a condition of $0.05 \leq T/H \leq 0.3$, where T denotes a thickness of the single gas permeable plate, and H denotes a distance between the first surface and the second surface measured in a direction perpendicular to the single gas permeable plate.

Based on the above, the embodiments of the invention achieve at least one of the following advantages or effects. Because gas passes through multiple through holes of the baffle plate before reaching the gas permeable plate, the multiple through holes may preliminarily regulate the gas flow to help to develop a steady laminar gas flow and thus equalize the flow velocity of the gas discharged from the gas permeable plate. Under the circumstance, the wind pressure exerted on the gas permeable plate can be reduced. This may prevent the gas permeable plate from being damaged by long-term high wind pressures. Furthermore, in some process environments, the space reserved for a gas curtain device is significantly limited, and it follows that the space reserved for a main body of the gas curtain device is also reduced. Under the circumstance, in case two gas permeable plates are used as in conventional designs, the overall thickness of the gas permeable plates is too high to cause an insufficient space between the gas inlet and the gas permeable plates for developing a uniform flow, which results in a non-uniform flow velocity of clean gas blown out from the gas curtain device. According to the above embodiments, because the thickness of a baffle plate can be smaller than the thickness of a gas permeable plate, the overall space occupied by a gas permeable assembly can be reduced. Therefore, even the gas curtain device is used in a limited-space environment, a sufficient space for developing a steady flow field between the gas inlet and the gas permeable plate can be still achieved to obtain a uniform gas flow discharged from the gas permeable assembly. Furthermore, by adjusting design parameters of through holes on the baffle plate, such as the arrangement, diameter, and spacing of the through holes, the flow pattern and velocity of the gas passing through the baffle plate can be optimized to therefore improve the wind pressure resistance and gas flow uniformity of the gas permeable plate. Besides, in one embodiment, diameters of pores of the gas permeable plate are smaller than diameters of the through holes to achieve a fine adjustment on gas discharging velocity, where the gas flow velocity may be first coarsely adjusted by the baffle plate with through holes and then finely adjusted by the gas permeable plate containing pores.

Other objectives, features and advantages of the invention will be further understood from the further technological features disclosed by the embodiments of the invention wherein there are shown and described preferred embodiments of this invention, simply by way of illustration of modes best suited to carry out the invention.

DETAILED DESCRIPTION OF THE INVENTION

In the following detailed description of the preferred embodiments, reference is made to the accompanying drawings which form a part hereof, and in which are shown by way of illustration specific embodiments in which the invention may be practiced. In this regard, directional terminology, such as "top," "bottom," "front," "back," etc., is used with reference to the orientation of the Figure(s) being described. The components of the present invention can be positioned in a number of different orientations. As such, the directional terminology is used for purposes of illustration and is in no way limiting. On the other hand, the drawings are only schematic and the sizes of components may be exaggerated for clarity. It is to be understood that other embodiments may be utilized and structural changes may be made without departing from the scope of the present invention. Also, it is to be understood that the phraseology and terminology used herein are for the purpose of description and should not be regarded as limiting. The use of "including," "comprising," or "having" and variations thereof herein is meant to encompass the items listed thereafter and equivalents thereof as well as additional items. Unless limited otherwise, the terms "connected," "coupled," and "mounted" and variations thereof herein are used broadly and encompass direct and indirect connections, couplings, and mountings. Similarly, the terms "facing," "faces" and variations thereof herein are used broadly and encompass direct and indirect facing, and "adjacent to" and variations thereof herein are used broadly and encompass directly and indirectly "adjacent to". Therefore, the description of "A" component facing "B" component herein may contain the situations that "A" component directly faces "B" component or one or more additional components are between "A" component and "B" component. Also, the description of "A" component "adjacent to" "B" component herein may contain the situations that "A" component is directly "adjacent to" "B" component or one or more additional components are between "A" component and "B" component. Accordingly, the drawings and descriptions will be regarded as illustrative in nature and not as restrictive.

Figure 1:
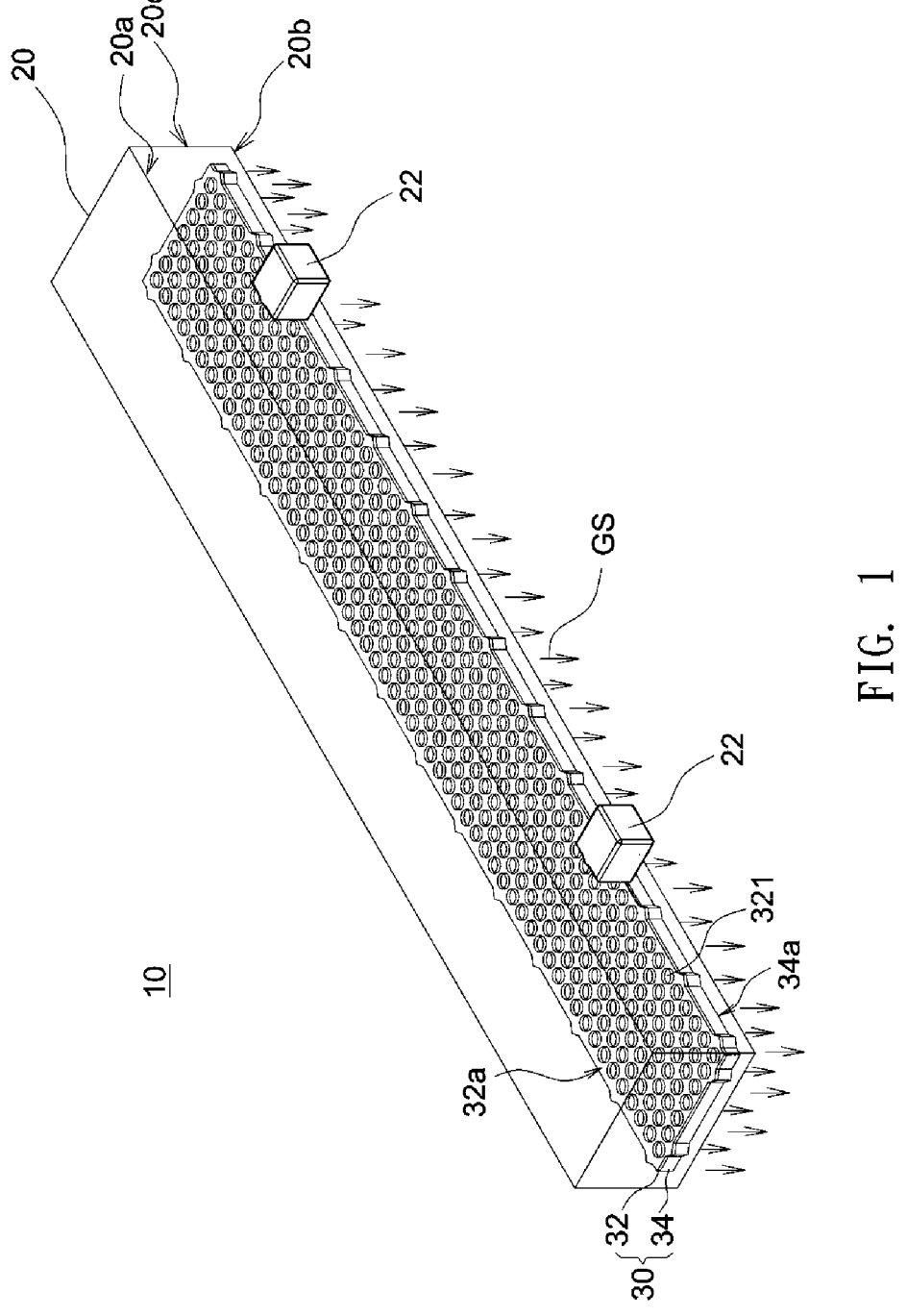
FIG. 1 shows a schematic diagram of a gas curtain device according to an embodiment of the invention.

FIG. 1 shows a schematic diagram of a gas curtain device according to an embodiment of the invention. As shown in FIG. 1, the gas curtain device 10 includes a main body 20 and a gas permeable assembly 30, the main body 20 includes a first surface 20a, a second surface 20b opposite the first surface 20a, and at least one side surface 20c connected between the first surface 20a and the second surface 20b.

Besides, the main body 20 is provided with at least one gas inlet 22. In this embodiment, two gas inlets 22 are provided at different positions on the side surface 20c of the main body 20, but the invention is not limited thereto. The gas permeable assembly 30 is accommodated in the main body 20 and includes a baffle plate 32 and a gas permeable plate 34. The baffle plate 32 is disposed downstream from the gas inlet 22 in a gas flow path and has a plurality of through holes 321. The gas permeable plate 34 is disposed downstream from the baffle plate 32 in the gas flow path, and the gas permeable plate 34 may be made of a porous material containing plenty of pores. A gas GS provided by a gas supply (not shown) enters the main body 20 via a gas inlet 22, and the gas GS is discharged from the gas permeable plate 34 after passing through the through holes 321 of the baffle plate 32. Therefore, in this embodiment, the baffle plate 32 is provided with a gas inlet face 32a of the gas permeable assembly 30, and the gas permeable plate 34 is provided with a gas outlet face 34a of the gas permeable assembly 30. In this embodiment, the baffle plate 32 is stacked on the gas permeable plate 34 without a gap between them, but the invention is not limited thereto. Furthermore, the main body 20 is not limited to a specific shape or structure and may be, for example, in the form of a casing, an outer frame or a box.

Figure 2:
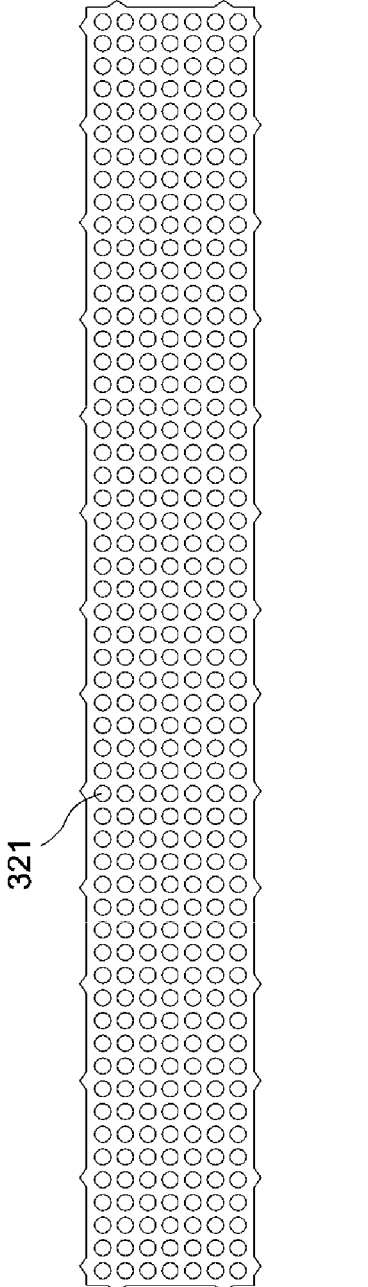
FIG. 2 shows a schematic plan view of a baffle plate according to an embodiment of the invention.

FIG. 2 shows a schematic plan view of a baffle plate according to an embodiment of the invention. As shown in FIG. 2, in one embodiment, the baffle plate 32 is provided with multiple regularly-arranged through holes 321. The through holes 321 are holes that penetrate the baffle plate 32 along a thickness direction, so that gas can pass through the baffle plate 32 via the through holes 321. The through holes 321 can be formed by various methods without limitation. For example, the baffle plate 32 may be a stainless steel plate, and multiple through holes 321 are formed on the stainless steel plate by laser drilling or mechanical drilling. It should be noted that the baffle plate 32 is not restricted to be made of a specific material, so long as it may provide sufficient structural strength to carve out the through holes 321. For example, the baffle plate 32 may be made of metal (e.g. stainless steel, aluminum or titanium alloy), fiber materials (e.g. glass fiber), or composite materials (e.g. epoxy glass fiber). Preferably, the baffle plate 32 is made of an inorganic material beneficial to eliminate volatile organic compound (VOC) emissions. In one embodiment, diameters of the through holes 321 are within a range of 0.1 mm to 10 mm, preferably 1 mm to 6 mm, and the through holes 321 may be arranged in an irregular manner as required without limitation. In one embodiment, a thickness of the baffle plate 32 is within a range of 0.1 mm to 2 mm, and preferably 0.8 mm-1.6 mm. In this embodiment, the baffle plate 32 has a thickness of 1.2 mm, and the through holes 321 have a diameter of 5 mm.

Figures 3A, 3B:
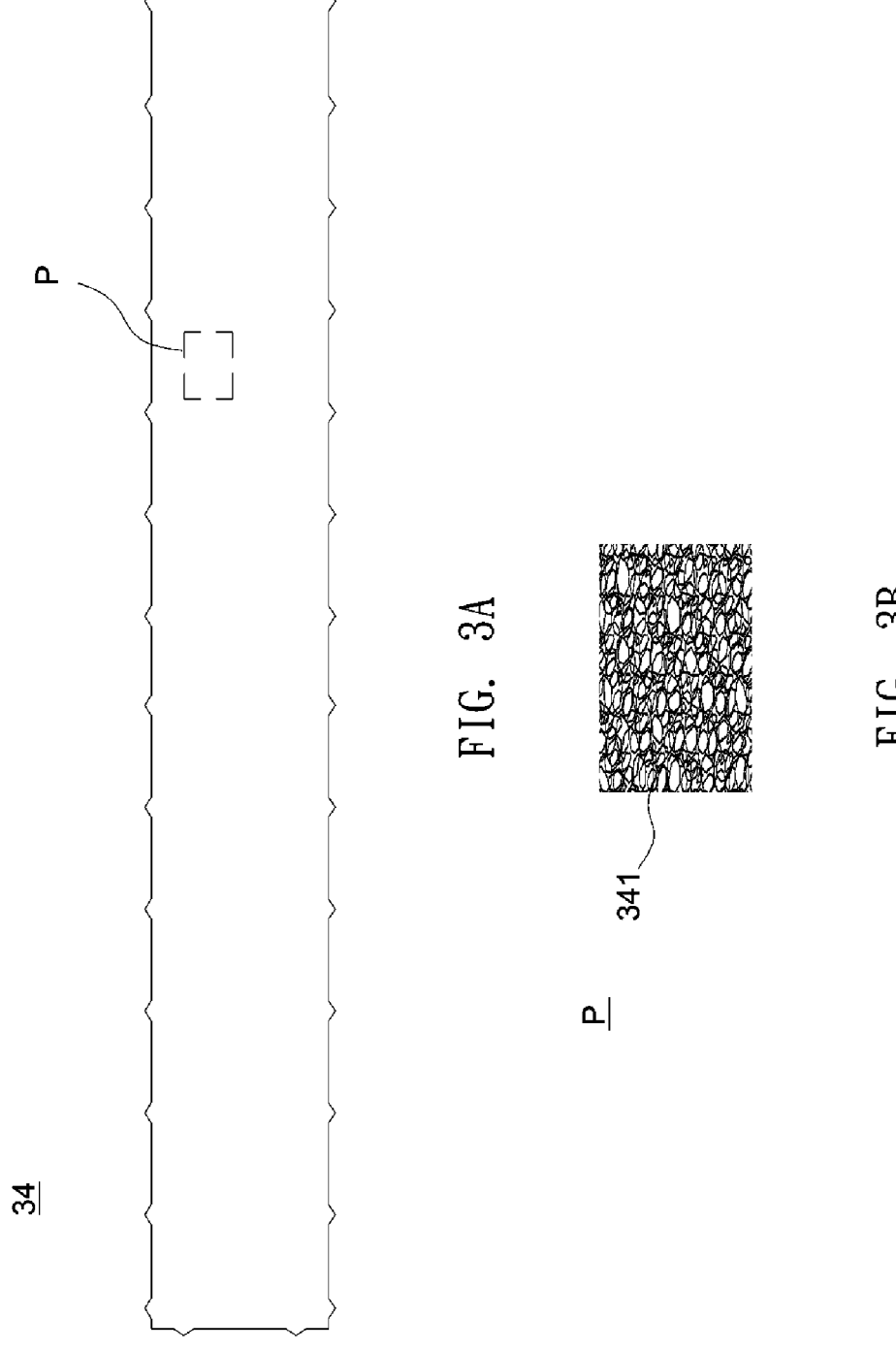
FIG. 3A shows a schematic plan view of a gas permeable plate according to an embodiment of the invention.
FIG. 3B shows an enlarged partial diagram P of FIG. 3A.

FIG. 3A shows a schematic plan view of a gas permeable plate according to an embodiment of the invention, and FIG. 3B shows an enlarged partial diagram P of FIG. 3A. As shown in FIGS. 3A and 3B, the gas permeable plate 34 is made of a material containing plenty of pores 341, such as a porous material, and the material containing plenty of pores 341 may be sintered metal, porous ceramics, resin, ultra-high molecular weight polyethylene (UPE), Teflon (PTFE), etc. In one embodiment, diameters of pores 341 of the gas permeable plate 34 may be within a range of 0.01 mm to 1 mm. In one embodiment, a thickness of the gas permeable plate 34 may be within a range of 2 mm to 10 mm, and preferably 4 mm to 9 mm. In this embodiment, a thickness of the gas permeable plate 34 is 5 mm. In one embodiment, diameters of the through holes 321 of the baffle plate 32 are larger than diameters of the pores 341 of the gas permeable plate 34.

Figure 4:
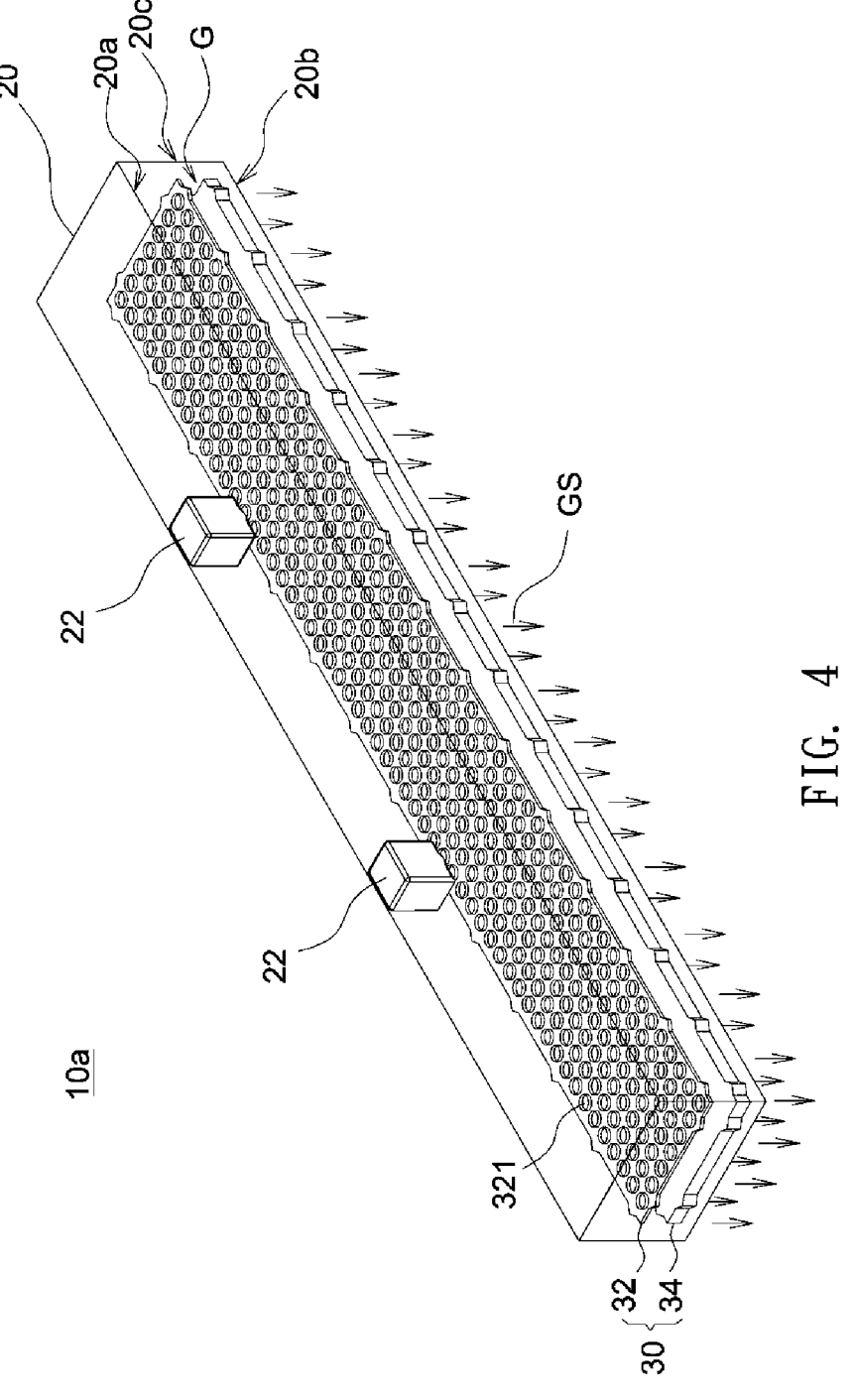
FIG. 4 shows a schematic diagram of a gas curtain device according to another embodiment of the invention.
Figure 5:
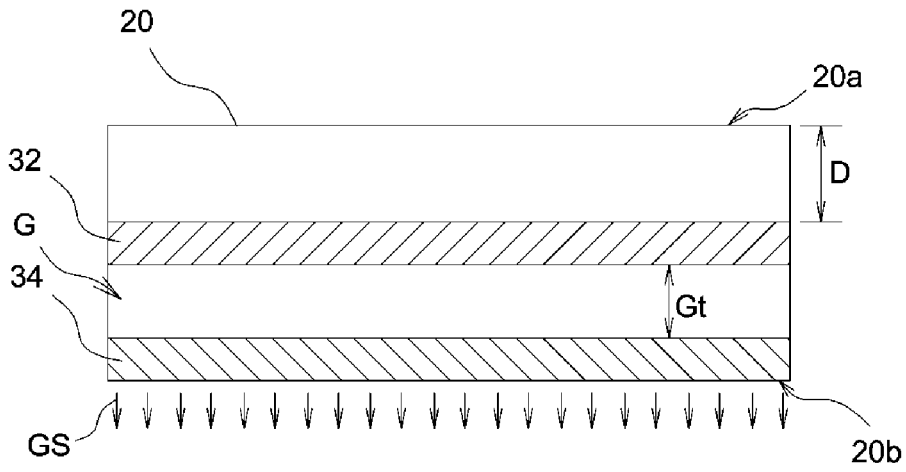
FIG. 5 is a schematic diagram showing an arrangement of a baffle plate and a gas permeable plate according to an embodiment of the invention.

FIG. 4 shows a schematic diagram of a gas curtain device according to another embodiment of the invention. In the gas curtain device 10*a* of FIG. 4, two gas inlets 22 are disposed on a first surface 20*a* of the main body 20, and a gap G is formed between the baffle plate 32 and the gas permeable plate 34. As shown in FIG. 5, in case a gap G exists between the baffle plate 32 and the gas permeable plate 34, the gas curtain device 10*a* may satisfy a condition of 0.5≤Gt/D≤1, where Gt denotes a thickness of the gap G, and D denotes a distance between the baffle plate 32 and the first surface 20*a* (the surface of the main body 20 furthest from the gas permeable plate 34). Meeting the above condition allows the gap G to function as a buffer layer to assist in developing a steady flow field, thereby enhancing uniformity of the flow velocity of the gas GS discharged from the gas permeable plate 34.

According to the above embodiments, because gas passes through multiple through holes of the baffle plate before reaching the gas permeable plate, the multiple through holes may preliminarily regulate the gas flow to help to develop a steady laminar gas flow and thus may equalize the flow velocity of the gas discharged from the gas permeable plate. Under the circumstance, the wind pressure exerted on the gas permeable plate can be reduced. This may prevent the gas permeable plate from being damaged by long-term high wind pressures. Furthermore, in some process environments, the space reserved for a gas curtain device is significantly limited, and it follows that the space reserved for a main body of the gas curtain device is also reduced. Under the circumstance, in case two gas permeable plates are used as in conventional designs, the overall thickness of the gas permeable plates is too high to cause an insufficient space between the gas inlet and the gas permeable plates for developing a uniform flow, which results in a non-uniform flow velocity of clean gas blown out from the gas curtain device. According to the above embodiments, because the thickness of a baffle plate with through holes can be smaller than the thickness of a gas permeable plate containing pores, the overall space occupied by a gas permeable assembly can be reduced. Therefore, even the gas curtain device is used in a limited-space environment, a sufficient space for developing a steady flow field between the gas inlet and the gas permeable plate can be still achieved to obtain a uniform gas flow discharged from the gas permeable assembly. Furthermore, by adjusting design parameters of through holes on the baffle plate, such as the arrangement, diameter, and spacing of through holes, the flow pattern and velocity of the gas passing through the baffle plate can be optimized to therefore improve the wind pressure resistance and gas flow uniformity of the gas permeable plate. Besides, in one embodiment, diameters of poles of the gas permeable plate are smaller than diameters of through holes to achieve a fine adjustment on gas discharging velocity, where the gas flow velocity may be first coarsely adjusted by the baffle plate with through holes and then finely adjusted by the gas permeable plate containing pores.

Figure 6:
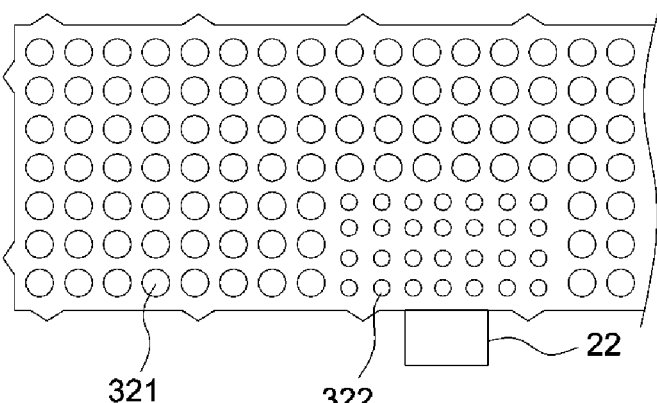
FIG. 6 shows a schematic plan view of a baffle plate according to another embodiment of the invention.

In various embodiments of the invention, the shape, size and arrangement of the through holes of the baffle plate 32 can be changed according to actual needs without limitation, and can be adjusted to optimize the flow pattern and velocity of the gas passing through the baffle plate 32. For example, the through holes may include variable cross-sectional sizes (e.g., diameters) and thus different cross-sectional areas through the baffle plate 34. As shown in FIG. 6, the baffle plate 34 may be provided with a first type of through holes 321 with a larger diameter and a second type of through holes 322 with a smaller diameter. Because an area near the gas inlet 22 has a comparatively higher gas flow velocity, this area can be distributed with the through holes 322 having a smaller diameter, and other area away from the gas inlet 22 can be distributed with the through holes 321 having a larger diameter to balance the gas flow through the baffle plate 34.

Figure 7A:
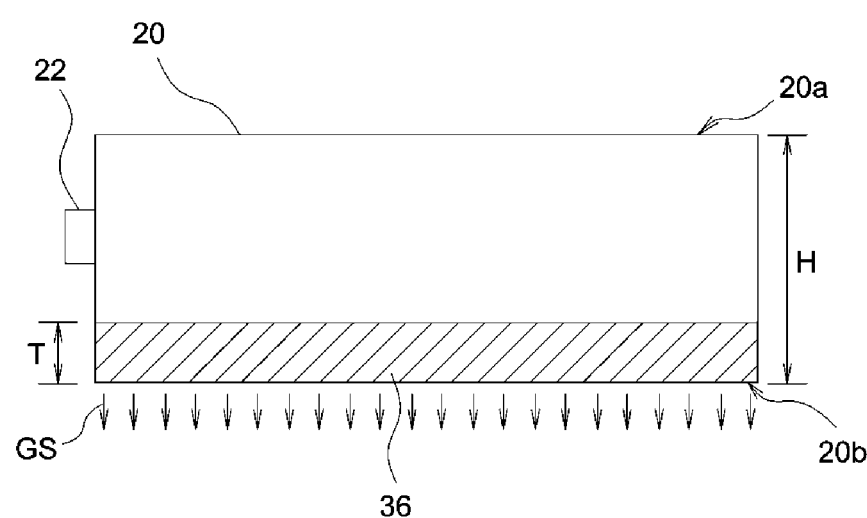
FIG. 7A shows a schematic diagram of a gas curtain device according to another embodiment of the invention.
Figure 7B:
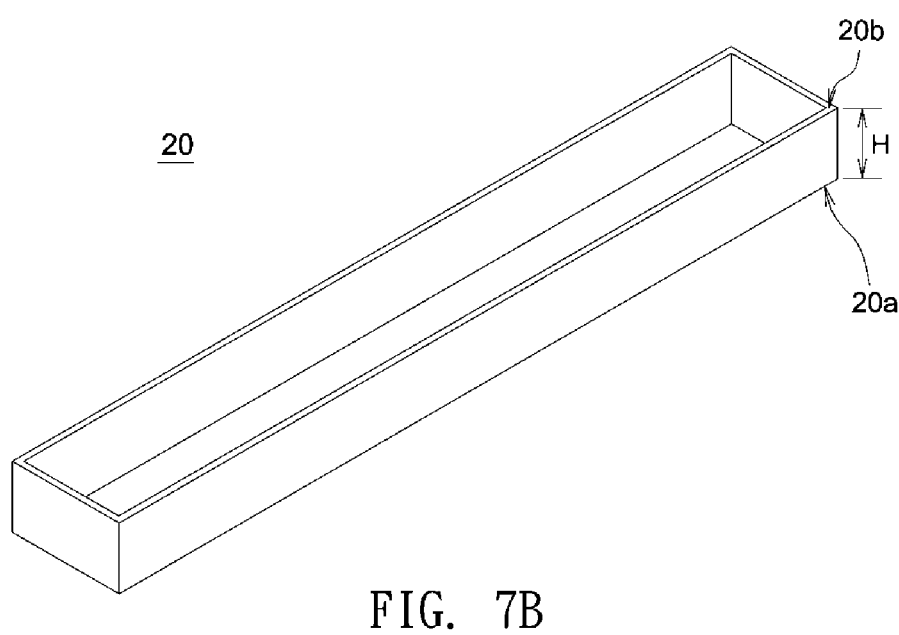
FIG. 7B shows a schematic three-dimensional view of a main body according to an embodiment of the invention.

FIG. 7A shows a schematic diagram of a gas curtain device according to another embodiment of the invention. As shown in FIG. 7A, the gas curtain device 10*b* includes a main body 20 and a single gas permeable plate 36. The main body 20 has a first surface 20*a* and a second surface 20*b* opposite the first surface 20*a*, and the gas permeable plate 36 is disposed adjacent to the second surface 20*b* of the main body 20. The gas GS provided by an external gas supply (not shown) enters the main body 20 and is uniformly discharged to the outside after passing through the single gas permeable plate 36 to form a gas wall or gas curtain. FIG. 7B shows a schematic three-dimensional view of a main body according to an embodiment of the invention. Referring to FIG. 7B, the main body 20 can be, for example, a hollow frame with an opening, and the second surface 20*b* is an end surface of the main body 20 close to the opening (or the gas permeable plate 36). In this embodiment, the gas permeable plate 36 is made of a porous material containing plenty of pores and may satisfy a condition of 0.05≤T/H≤0.3, where T is a thickness of the gas permeable plate 36, and H is a distance between the first surface 20*a* and the second surface 20*b* measured in a direction perpendicular to the gas permeable plate 36. Meeting the above condition can achieve a balance between providing a sufficient space to develop a steady flow field and providing a sufficient thickness for the gas permeable plate 36 to homogenize the flow velocity of discharged gas. Furthermore, in one embodiment, the gas GS entering the main body 20 via the gas inlet 22 is discharged from the gas permeable plate 36 at a flow velocity of 0.1 m/s to 2 m/s.

In one embodiment, the gas permeable assembly 30 is fixed in the main body 20 by adhesion or mechanical engagement and defines a space in the main body 20 in communication with the gas inlet 22. When the pressure of a clean gas introduced via the gas inlet 22 is greater than a preset value, the clean gas is uniformly discharged from the gas permeable plate adjacent to the opening of the main body to form a gas wall.

In various embodiments of the invention, the gas GS discharged from a gas curtain device through a gas permeable assembly may be a clean gas, and the clean gas may be, for example, clean dry air (CDA), extreme clean dry air (X-CDA) or inert gas. The gas GS may be discharged from a gas curtain device at a velocity of 0.1 m/s-2 m/s, and the gas GS may enter the gas curtain device at a flow rate of no more than 800 L/min. Furthermore, the baffle plate is not limited to be a separate piece. In other embodiment, for example, a part of the main body may be carved out to form multiple through holes to function as a baffle plate 34.

Figure 8:
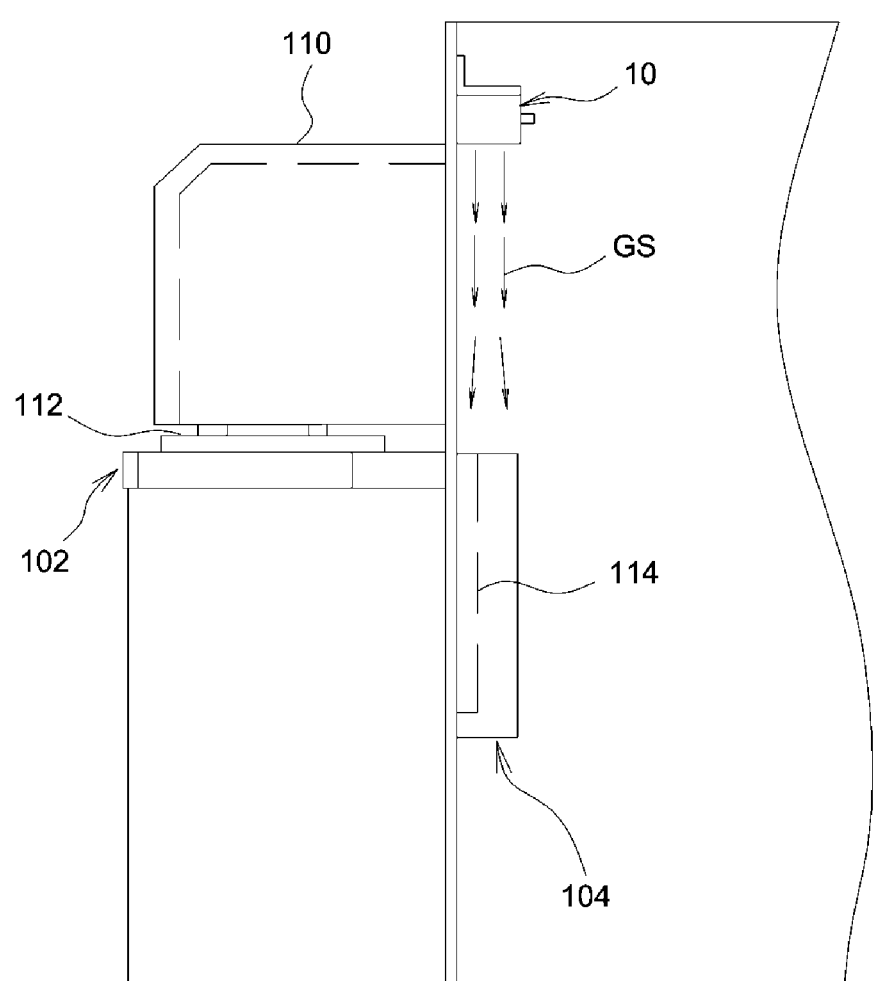
FIG. 8 is a schematic diagram showing a gas curtain device used in a wafer transfer apparatus according to an embodiment of the invention.

FIG. 8 is a schematic diagram showing a gas curtain device used in a wafer transfer apparatus according to an embodiment of the invention. In this embodiment, the wafer transfer apparatus 100 may include one or more load ports 102 and door openers 104, the load port 102 may, for example, hold a contact surface 112 of a front opening unified pod (FOUP) 110 to receive and dock a respective FOUP 110, and the door opener 104 is used to open a carrier door 114 of the FOUP 110 and slides the carrier door 114 away from the FOUP 110, so that the inside of the FOUP 110 is allowed to communicate with the external environment. The gas curtain device 10 may be fixed on one side of the wafer transfer apparatus 100. For example, the gas curtain device 10 is disposed above the door opener 104. When the door opener 104 opens the carrier door 114, the gas curtain device 10 continuously and uniformly discharges the clean gas GS towards the door opener 104 to form a gas wall or gas curtain, preferably a laminar-flow gas wall or gas curtain, to prevent external contaminated particles from entering the inside of the FOUP 110. It should be noted that the wafer transfer apparatus that the gas curtain device is used with is merely an example, and the gas curtain device in various embodiments can be used with different machines, devices and workpieces in different semiconductor process environments without limitation.

The foregoing description of the preferred embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to best explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to particularly preferred exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. The abstract of the disclosure is provided to comply with the rules requiring an abstract, which will allow a searcher to quickly ascertain the subject matter of the technical disclosure of any patent issued from this disclosure. It is submitted with the understanding that it will not be used to interpret or limit the scope or meaning of the claims. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A gas curtain device, comprising:

a main body having at least one gas inlet, wherein the main body includes a first surface, a second surface opposite the first surface, and at least one side surface connected between the first surface and the second surface; and a gas permeable assembly disposed inside the main body, and the gas permeable assembly comprising:

a baffle plate disposed downstream from the gas inlet in a gas flow path and provided with a plurality of through holes; and a gas permeable plate disposed downstream from the baffle plate in the gas flow path and made of a porous material containing a plurality of pores, wherein the gas permeable plate is the most downstream plate of the gas permeable assembly in the gas flow path, diameters of the pores of the gas permeable plate are smaller than diameters of the through holes of the baffle plate, the gas permeable plate is spaced from the baffle plate by a gap, the first surface is farther from the gas permeable plate than the second surface, and the gas curtain device satisfies a condition of $0.5 \leq Gt/D \leq 1$, where Gt denotes a thickness of the gap between the baffle plate and the gas permeable plate, and D denotes a distance between the baffle plate and the first surface of the main body.

2. The gas curtain device as claimed in claim 1, wherein a thickness of the baffle plate is smaller than a thickness of the gas permeable plate.

3. The gas curtain device as claimed in claim 1, wherein the plurality of through holes are provided with at least two different diameters.

4. The gas curtain device as claimed in claim 3, wherein some of the through holes near the gas inlet has a first diameter, some of the through holes away from the gas inlet has a second diameter, and the first diameter is smaller than the second diameter.

5. The gas curtain device as claimed in claim 1, wherein a thickness of the baffle plate is within a range of 0.1 mm to 2 mm, and a thickness of the gas permeable plate is within a range of 2 mm to 10 mm.

6. The gas curtain device as claimed in claim 1, wherein diameters of the through holes are within a range of 0.1 mm to 10 mm, and diameters of the plurality of pores of the gas permeable plate are within a range of 0.01 mm to 1 mm.

7. The gas curtain device as claimed in claim 1, wherein the gas is clean dry air (CDA), extreme clean dry air (X-CDA) or inert gas.

8. The gas curtain device as claimed in claim 1, wherein the gas is discharged from the gas curtain device at a velocity of 0.1 m/s-2 m/s.

9. The gas curtain device as claimed in claim 1, wherein the baffle plate is made of metal, fiber materials or composite materials, and the gas permeable plate is made of sintered metal, porous ceramics, resin, ultra-high molecular weight polyethylene (UPE) or Teflon (PTFE).

* * * * *